(12) United States Patent　　(10) Patent No.:　　US 7,044,195 B2
Chen et al.　　(45) Date of Patent:　　May 16, 2006

(54) HEAT DISSIPATION STRUCTURE

(75) Inventors: Chin-ming Chen, Taoyuan (TW); Yu-hung Huang, Ilan (TW); Wei-fang Wu, Taichung (TW)

(73) Assignee: Delta Electronics, Inc., (TW)

( * ) Notice: Subject to any disclaimer, the term of this patent is extended or adjusted under 35 U.S.C. 154(b) by 306 days.

(21) Appl. No.: 10/637,374

(22) Filed: Aug. 7, 2003

(65) Prior Publication Data
US 2004/0250991 A1　　Dec. 16, 2004

(30) Foreign Application Priority Data
Jun. 10, 2003　(TW)　................. 92210560 U

(51) Int. Cl.
*H05K 7/20*　　(2006.01)

(52) U.S. Cl. .................. 165/80.3; 165/121; 361/697; 361/704

(58) Field of Classification Search ............ 165/80.3, 165/104.33, 185; 361/697, 704, 705, 710
See application file for complete search history.

(56) References Cited

U.S. PATENT DOCUMENTS

| | | | | |
|---|---|---|---|---|
| 4,513,812 A * | 4/1985 | Papst et al. | ................. | 165/80.1 |
| 5,335,722 A * | 8/1994 | Wu | ..................... | 165/122 |
| 5,484,013 A * | 1/1996 | Morikawa et al. | ......... | 165/80.3 |
| 5,689,404 A * | 11/1997 | Katsui | ................. | 361/697 |
| 6,373,700 B1 * | 4/2002 | Wang | ..................... | 361/698 |
| 6,504,720 B1 * | 1/2003 | Furuya | ................. | 361/699 |
| 6,712,129 B1 * | 3/2004 | Lee | ..................... | 165/104.21 |
| 6,752,201 B1 * | 6/2004 | Cipolla et al. | ......... | 165/121 |
| 6,883,594 B1 * | 4/2005 | Sarraf et al. | ......... | 165/104.33 |
| 2003/0019607 A1 * | 1/2003 | Wei | ..................... | 165/46 |
| 2003/0183373 A1 * | 10/2003 | Sarraf et al. | ......... | 165/104.33 |

* cited by examiner

*Primary Examiner*—Allen J. Flanigan
(74) *Attorney, Agent, or Firm*—Martine Penilla & Gencarella, LLP

(57) ABSTRACT

A heat dissipation structure made of a heat-conductive material, comprising at least one penetration portion which penetrates therethrough. The at least one penetration portion further comprises a solid portion which is located at the center of the at least one penetration portion and provided with a penetration hole penetrating therethrough, and at least one bridge portion which surrounds the solid portion and is connected between the solid portion and the body of the heat dissipation structure.

7 Claims, 5 Drawing Sheets

100

101
102

HEAT DISSIPATION STRUCTURE

BACKGROUND OF THE INVENTION

1. Field of the Invention

The invention relates to a heat dissipation structure, and more particularly, to a heat dissipation structure capable of increasing the efficiency in heat dissipation when an existing heat sink is introduced.

2. Description of the Related Art

Please refer to FIGS. 1A–1C, illustrating a heat sink 100 in three views according to the prior art. As illustrated in FIG. 1A, the heat sink 100 has a plurality of fins 101 and a base 102. In general, both of the fins 101 and the base 102 are made of a heat-conductive material, such as Al, Cu.

As illustrated in FIG. 2, the heat sink 100 is generally disposed on a central processing unit (CPU) module composed of a CPU 103, a socket 104, a PCB 105 and a standoff 106, thereby the base 102 and the CPU 103 are contacted to each other. Accordingly, when the CPU 103 is operating and thus causes an increase in temperature, the heat can be propagated to the fins 101 via the base 102 and dissipated by the way of free convection. Also, as illustrated in FIG. 3, the heat can be dissipated by the way of forced convection achieved by blowing the fins 101 (indicated by an arrow in FIG. 3) while the CPU 103 is operating.

Regardless of the materials of the fins 101 and the base 102 and the way of dissipating, the efficiency in heat dissipation of the heat sink 100 (i.e. the amount of heat can be propagated per unit time) is dominated by the thermal resistance itself. That is, the efficiency in heat dissipation of the heat sink 100 is limited and governed by the material thereof, such as Al and Cu.

In view of this, a heat dissipation structure is required, which enables the heat sink 100 to achieve an improved efficiency in heat dissipation even if the conventional efficiency in heat dissipation is governed by the material thereof.

SUMMARY OF THE INVENTION

Thus, it is an object of the present invention to provide a heat dissipation structure which enables the existing heat sink to achieve an improved efficiency in heat dissipation.

According to a first preferred embodiment of the present invention, a heat dissipation structure made of a heat-conductive material includes at least one penetration portion penetrating through the heat dissipation structure. The at least one penetration portion further has a solid portion located at a center of the at least one penetration portion and at least one bridge portion surrounding the solid portion and interposed between the solid portion and a body of the heat dissipation structure.

It is preferred that the heat dissipation structure further has a rib-shaped portion configured on at least one surface of the heat dissipation structure, and the rib-shaped portion is formed with a plurality of ribs separated from each other so as to dissipate the heat propagated from a heat source to the body of the heat dissipation structure via the plurality of ribs.

It is preferred that the at least one surface of the heat dissipation structure formed with the rib-shaped portion is opposite to a cooling device.

According to a second preferred embodiment of the present invention, a heat dissipation structure made of a heat-conductive material includes at least one penetration portion penetrating through the heat dissipation structure. The at least one penetration portion further has a gas-guiding portion interposed across the at least one penetration portion for separating the at least one penetration portion, so as to increase a contact surface of the heat dissipation structure with an air stream.

It is preferred that the heat dissipation structure further has a rib-shaped portion configured on at least one surface of the heat dissipation structure, and the rib-shaped portion is formed with a plurality of ribs separated from each other so as to dissipate the heat propagated from a heat source to the body of the heat dissipation structure via the plurality of ribs.

It is preferred that the at least one surface of the heat dissipation structure formed with the rib-shaped portion is opposite to a cooling device.

According to a third preferred embodiment of the present invention, a heat dissipation module includes a first heat dissipation structure made of a heat-conductive material which consists of a base and a plurality of fins and a second heat dissipation structure made of the heat-conductive material. The second heat dissipation structure further has at least one penetration portion penetrating through the second heat dissipation structure and a heat-transmitter configured with two ends connected to the second heat dissipation structure and the base of the first heat dissipation structure, respectively.

It is preferred that the at least one penetration portion of the second heat dissipation structure further has a solid portion located at a center of the at least one penetration portion and at least one bridge portion surrounding the solid portion and interposed between the solid portion and a body of the second heat dissipation structure.

It is preferred that the second heat dissipation structure further has a penetrating hole for enabling a heat-transmitter to penetrate the solid portion.

It is preferred that the second heat dissipation structure further has a concavity for receiving a heat-transmitter in the solid portion.

It is preferred that the second heat dissipation structure further has a rib-shaped portion configured on at least one surface of the second heat dissipation structure, and the rib-shaped portion is formed with a plurality of ribs separated from each other so as to dissipate the heat propagated from a heat source to the body of the second heat dissipation structure via the plurality of ribs.

It is preferred that the at least one surface of the second heat dissipation structure formed with the rib-shaped portion is opposite to a cooling device.

DETAILED DESCRIPTION OF THE PREFERRED EMBODIMENTS

Please refer to FIGS. 4A–4D, respective front views illustrating heat dissipation structures according to embodiments of the invention.

Figure 1A:
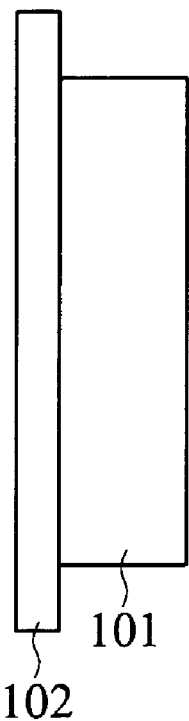
FIGS. 1A–1C illustrate a heat sink in three views according to the prior art.
Figure 1B:
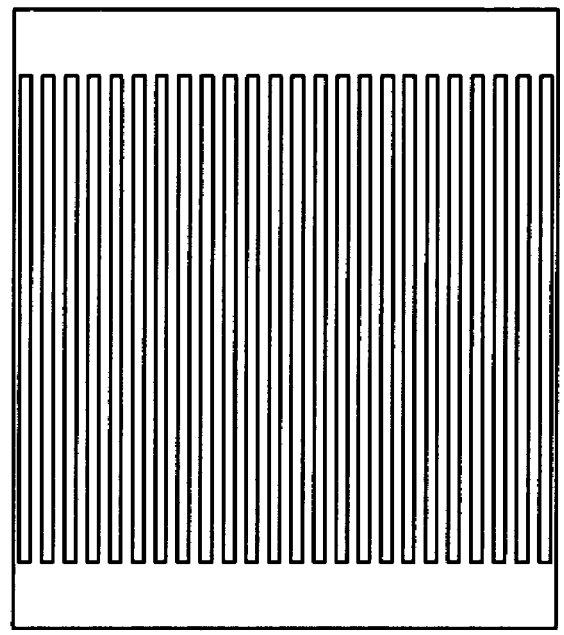
Figure 1C:
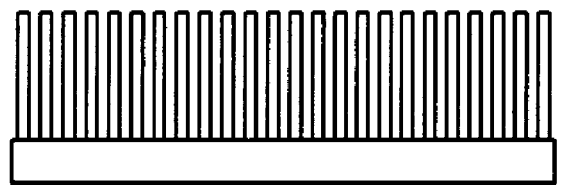
Figure 2:
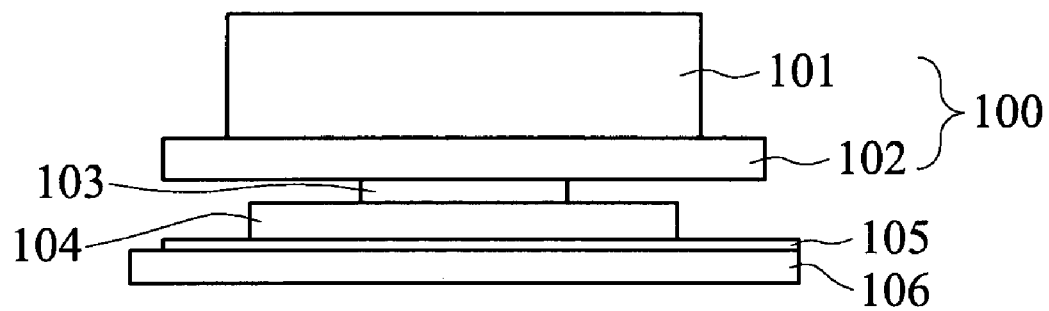
FIG. 2 illustrates an example of the introduction of existing heat sink to dissipate the heat caused by the CPU module.
Figure 3:
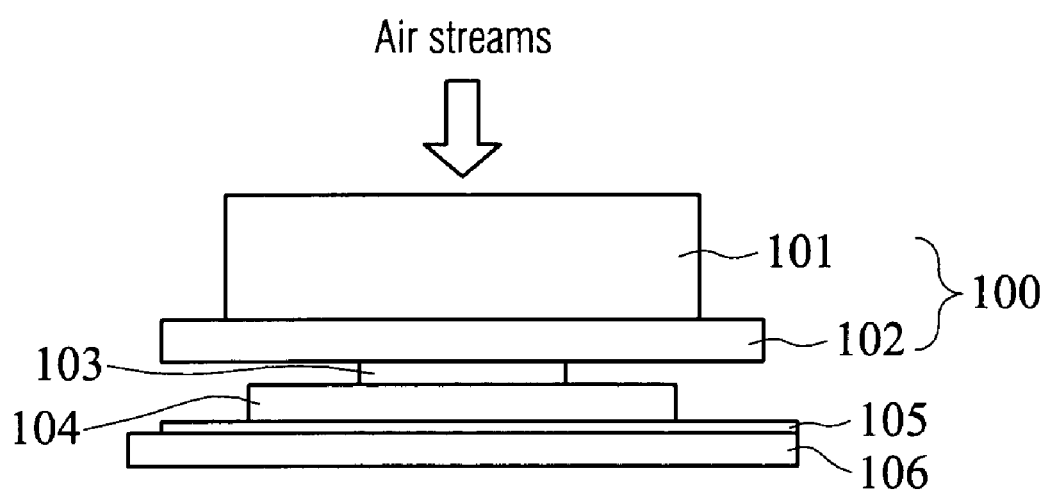
FIG. 3 illustrates another example of the introduction of existing heat sink to dissipate the heat caused by the CPU module.
Figure 4A:
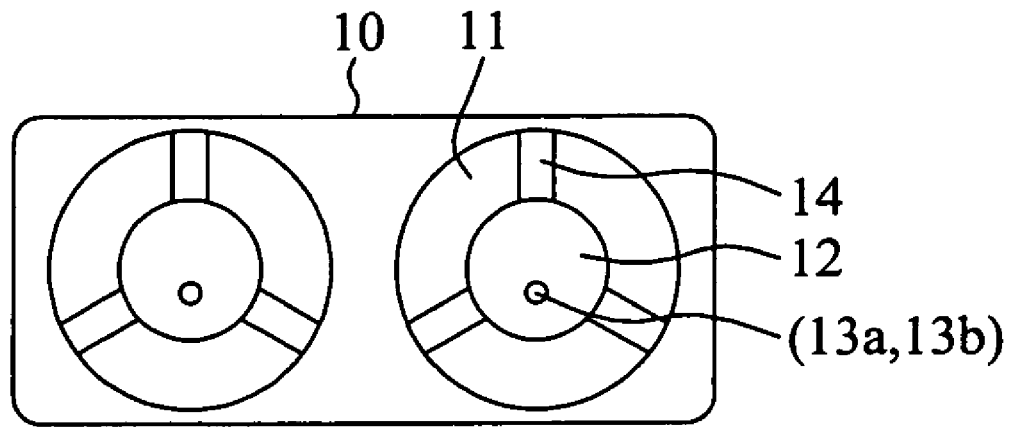
FIG. 4A is a front view illustrating a heat dissipation structure according to the first embodiment of the invention.

As illustrated in FIG. 4A, a heat dissipation structure 10 according to the first embodiment of the invention made of a heat-conductive material, such as Al, Cu, etc., includes at least one penetration portion 11 which penetrates through the heat dissipation structure 10. In specific, the penetration portion 11 further has a solid portion 12 located at a center of the penetration portion 11 and at least one bridge portion 14 surrounding the solid portion 12 and interposed between the solid portion 12 and a body of the heat dissipation structure 10. Preferably, the solid portion 12 further has a hole for connecting which receives a heat-transmitter 17 shown in FIG. 5A.

It is to be noted that the hole is either a penetrating hole 13a which penetrates the solid portion 12 (shown in FIGS. 4A and 4B) or a concavity 13b which doesn't penetrates the solid portion 12. The embodiments of the invention are described by the exemplary penetrating hole 13a.

In accordance with the invention, with the connection between one end of the heat-transmitter 17 and the penetrating hole 13a of the heat dissipation structure 10 as well as the connection between the other end of the heat-transmitter 17 and the base 102 of the conventional heat sink 100, it is possible to dramatically reduce the thermal resistance of the conventional heat sink 100 and thus improve the efficiency in heat dissipation thereof. In detail, since the heat sink 100 is connected to the heat dissipation structure 10 via the heat-transmitter 17, the heat dissipation structure 10 is effective in dissipating a portion of heat propagated from the heat sink 100 by itself once a cooling device, such as a fan, directly blows the heat dissipation structure 10 to cause the air streams to reach the fins 101 of the existing heat sink 100 passed through the penetration portion 11, so that the heat to be dissipated by the heat sink 100 can be diminished.

According to the experiment carried out by the inventors, it is found that the thermal resistance of the heat sink 100 without connecting to the heat dissipation structure 10 must be larger than that of the heat sink 100 with connecting to the heat dissipation structure 10 regardless of the amount of air streams toward the heat sink 100, and further, the amount of air streams toward the heat sink 100 is larger, the thermal resistance of the heat sink 100 with connecting to the heat dissipation structure 10 is smaller due to the heat dissipation structure 10. Moreover, it is also found that the thickness of the bridge portion 14 of the heat dissipation structure 10 is larger, the heat sink 100 connected with the heat dissipation structure 10 is smaller.

Thus, the heat dissipation structure 10 according to the first embodiment of the invention enables the conventional heat sink 100 to achieve an improved efficiency in heat dissipation.

Figure 4B:
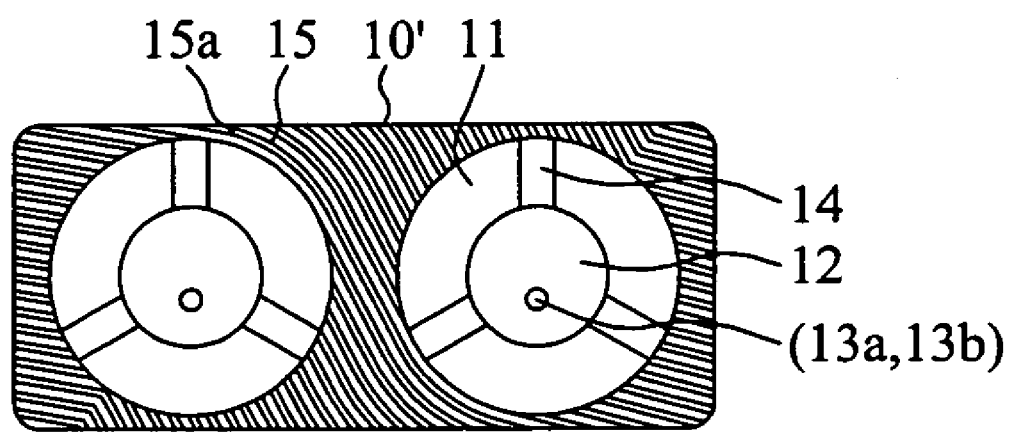
FIG. 4B is a front view illustrating a heat dissipation structure according to the second embodiment of the invention.
Figure 4A:
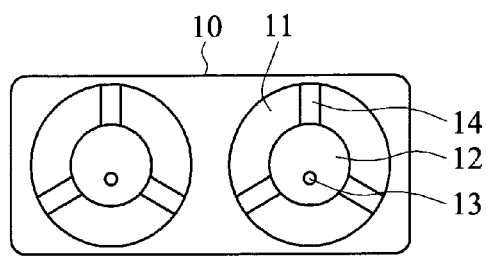

As illustrated in FIG 4B, in addition to the solid portion 12, the penetrating hole 13a and the penetration portion 11 provided with at least one bridge portion 14, the heat dissipation structure 10' according to the second embodiment of the invention further has a rib-shaped portion 15 configured on at least one surface of the heat dissipation structure 10'. In specific, the fib-shaped portion 15 is formed with a plurality of ribs 15a separated from each other so as to dissipate the heat propagated from a heat source to the body of the heat dissipation structure 10' via the plurality of ribs 15a.

Figure 5A:
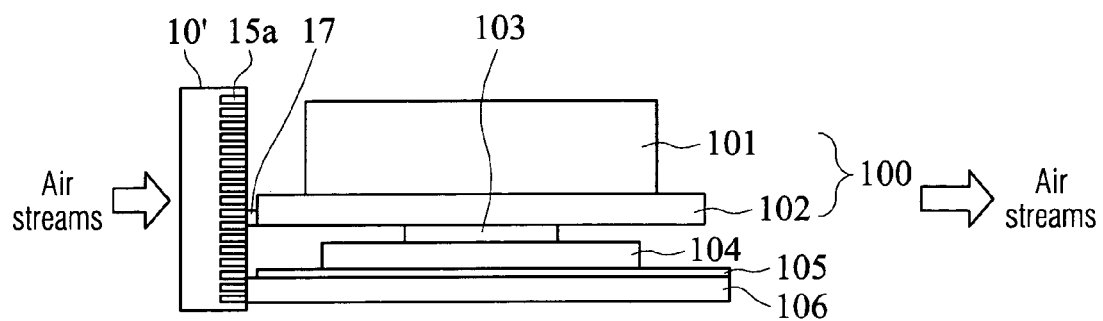
FIG. 5A illustrates an example of the introduction of the heat dissipation structure according to any one of embodiments of the invention and the conventional heat sink to dissipate the heat caused by the CPU module.

Accordingly, as illustrated in FIG 5A, with the connection between one end of the heat-transmitter 17 and the penetrating hole 13a of the heat dissipation structure 10' as well as the connection between the other end of the heat-transmitter 17 and the base 102 of the existing heat sink 100, it is possible to dramatically reduce the thermal resistance of the existing heat sink 100 and thus improve the efficiency in heat dissipation thereof. In detail, since the heat sink 100 is connected to the heat dissipation structure 10' via the heat-transmitter 17, the heat dissipation structure 10' is effective in dissipating a portion of heat propagated from the heat sink 100 by itself once a cooling device, such as a fan, directly blows the heat dissipation structure 10' (indicated by a left-side arrow in FIG 5A) to cause the air streams to reach the fins 101 of the existing heat sink 100 passed through the penetration portion 11 (indicated by a right-side arrow in FIG 5A), so that the heat to be dissipated by the heat sink 100 can be diminished. Thus, similar to the heat dissipation structure 10 according to the first embodiment of the invention, the heat dissipation structure 10' according to the second embodiment of the invention also enables the existing heat sink 100 to achieve an improved efficiency in heat dissipation.

Figure 4C:
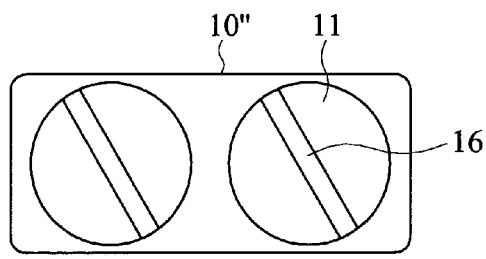
FIG. 4C is a front view illustrating a heat dissipation structure according to the third embodiment of the invention.
Figure 4B:
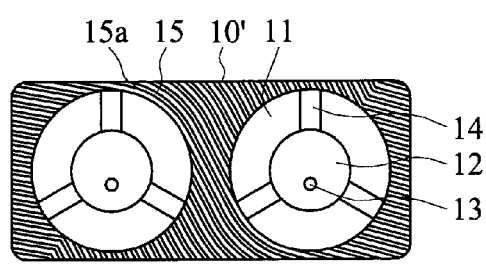

As illustrated in FIG. 4C, the heat dissipation structure 10" according to the third embodiment of the invention is made of the heat-conductive material, such as Al, Cu, etc., and has at least one penetration portion 11 which penetrates the heat dissipation structure 10". The penetration portion 11 further has a gas-guiding portion 16 interposed across the penetration portion 11 for separating the same.

According to the third embodiment of the invention, it is possible to omit the heat-transmitter 17 disposed between the heat dissipation structure 10" and the existing heat sink 100, and the heat dissipation structure 10" is still effective in dissipating a portion of heat propagated from the heat sink 100 by itself once a cooling device, such as a fan, directly blows the heat dissipation structure 10" to cause the air streams to reach the fins 101 of the existing heat sink 100 passed through the penetration portion 11, so that the heat to be dissipated by the heat sink 100 can be diminished. Thus, similar to the heat dissipation structures 10 and 10' according to the first and second embodiments of the invention, the heat dissipation structure 10" according to the third embodiment of the invention also enables the existing heat sink 100 to achieve an improved efficiency in heat dissipation.

Figure 4D:
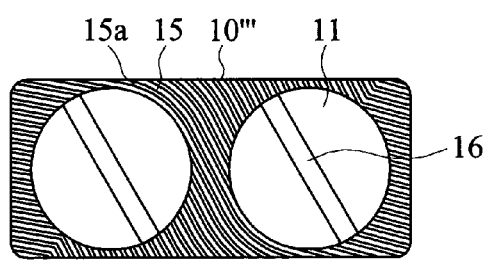
FIG. 4D is a front view illustrating a heat dissipation structure according to the fourth embodiment of the invention.

As illustrated in FIG. 4D, in addition to the penetration portion 11 provided with at least one gas-guiding portion 16, the heat dissipation structure 10''' according to the fourth embodiment of the invention further has a rib-shaped portion 15 configured on at least one surface of the heat dissipation structure 10'''. In specific, the rib-shaped portion 15 is formed with a plurality of ribs 15a separated from each other so as to dissipate the heat propagated from a heat source to the body of the heat dissipation structure 10''' via the plurality of ribs 15*a*.

According to the fourth embodiment of the invention, it is possible to omit the heat-transmitter 17 disposed between the heat dissipation structure 10''' and the existing heat sink 100, and the heat dissipation structure 10''' is still effective in dissipating a portion of heat propagated from the heat sink 100 by itself once a cooling device, such as a fan, directly blows the heat dissipation structure 10''' (indicated by a left-side arrow in FIG. 5B) to cause the air streams to reach the fins 101 of the existing heat sink 100 passed through the penetration portion 11 (indicated by a right-side arrow in FIG. 5B), so that the heat to be dissipated by the heat sink 100 can be diminished. Thus, similar to the heat dissipation structures 10, 10' and 10" according to the first to third embodiments of the invention, the heat dissipation structure 10''' according to the fourth embodiment of the invention also enables the existing heat sink 100 to achieve an improved efficiency in heat dissipation.

Figure 5B:
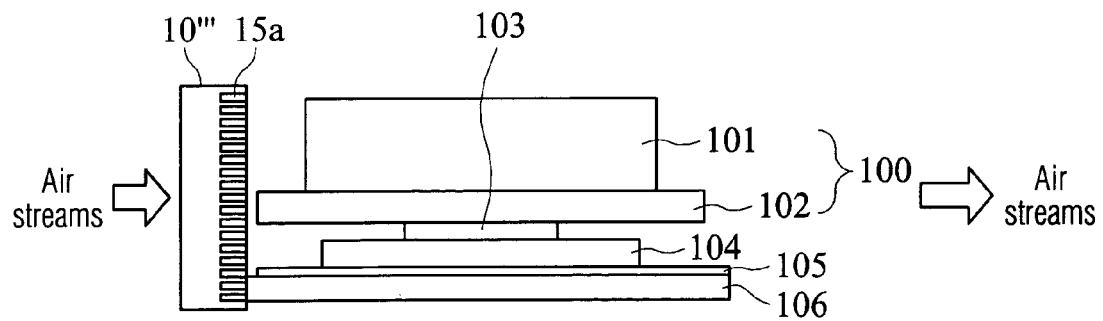
FIG. 5B illustrates another example of the introduction of the heat dissipation structure according to any one of embodiments of the invention and the conventional heat sink to dissipate the heat caused by the CPU module.

Moreover, as illustrated in FIG. 5A or 5B, the base 102 of the heat sink 100 is contacted with a heat source, such as the CPU 103, when the heat dissipation structure according to any of the embodiments and the existing heat sink are utilized. Accordingly, it is possible to effectively dissipate the heat resulted from the operating CPU 103 by way of the propagation from the base 102 to the fins 101 and the air streams blowing the heat dissipation structure of the invention (indicated as the left-side arrow of FIG. 5A or 5B).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A heat dissipation structure made of a heat-conductive material, comprising:
    at least one penetration portion penetrating through the heat dissipation structure, wherein the at least one penetration portion further comprises:
        a solid portion located at a center of the at least one penetration portion; and
        at least one bridge portion surrounding the solid portion and interposed between the solid portion and a body of the heat dissipation structure; and
    a rib-shaped portion configured on at least one surface of the heat dissipation structure, wherein the rib-shaped portion is formed with a plurality of ribs separated from each other so as to dissipate the heat propagated from a heat source to the body of the heat dissipation structure via the plurality of ribs.

2. The heat dissipation structure as recited in claim 1, wherein the surface of the heat dissipation structure formed with the rib-shaped portion is opposite to a cooling device.

3. The heat dissipation structure as recited in claim 1, wherein the solid portion further comprises a penetrating hole for enabling a heat-transmitter to penetrate the solid portion.

4. The heat dissipation structure as recited in claim 1, wherein the solid portion further comprises a concavity for receiving a heat-transmitter.

5. A heat dissipation module, comprising:
    a first heat dissipation structure made of a heat-conductive material, the first heat dissipation structure consisting of a base and a plurality of fins;
    a second heat dissipation structure made of the heat-conductive material, wherein the second heat dissipation structure further comprises:
        at least one penetration portion penetrating through the second heat dissipation structure;
        a heat-transmitter configured with two ends connected to the second heat dissipation structure and the base of the first heat dissipation structure, respectively; and
        a rib-shaped portion configured on at least one surface of the second heat dissipation structure, wherein the rib-shaped portion is formed with a plurality of ribs separated from each other so as to dissipate the heat propagated from a heat source to the body of the second heat dissipation structure via the plurality of ribs.

6. The heat dissipation module as recited in claim 5, wherein the penetration portion of the second heat dissipation structure further comprises:
    a solid portion located at a center of the at least one penetration portion; and
    at least one bridge portion surrounding the solid portion and interposed between the solid portion and a body of the second heat dissipation structure.

7. The heat dissipation module as recited in claim 5, wherein the surface of the second heat dissipation structure formed with the rib-shaped portion is opposite to a cooling device.

\* \* \* \* \*